US007325222B2

United States Patent
Strelkova et al.

(10) Patent No.: US 7,325,222 B2
(45) Date of Patent: Jan. 29, 2008

(54) METHOD AND APPARATUS FOR VERIFYING THE POST-OPTICAL PROXIMITY CORRECTED MASK WAFER IMAGE SENSITIVITY TO RETICLE MANUFACTURING ERRORS

(75) Inventors: Nadya G. Strelkova, Portland, OR (US); Ebo H. Croffie, Portland, OR (US); John V. Jensen, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/800,219

(22) Filed: Mar. 12, 2004

(65) Prior Publication Data

US 2005/0204328 A1    Sep. 15, 2005

(51) Int. Cl.
*G06F 17/50* (2006.01)
(52) U.S. Cl. .............................. 716/19; 716/4; 716/21
(58) Field of Classification Search .................... 716/4, 716/19, 21; 700/121; 430/5; 438/14, 16
See application file for complete search history.

(56) References Cited

U.S. PATENT DOCUMENTS

| 6,421,820 B1 * | 7/2002 | Mansfield et al. ............ 716/21 |
| 6,470,489 B1 * | 10/2002 | Chang et al. ................. 716/21 |
| 6,513,151 B1 * | 1/2003 | Erhardt et al. ................ 716/21 |
| 6,562,638 B1 * | 5/2003 | Balasinski et al. ............ 438/14 |
| 6,602,728 B1 * | 8/2003 | Liebmann et al. ............ 438/16 |
| 6,658,640 B2 * | 12/2003 | Weed .......................... 716/19 |
| 6,751,519 B1 * | 6/2004 | Satya et al. .................. 700/121 |
| 7,241,538 B2 * | 7/2007 | Zhang et al. .................. 430/5 |
| 2004/0123264 A1 * | 6/2004 | Tsai et al. ..................... 716/19 |
| 2004/0170905 A1 * | 9/2004 | Liebmann et al. ............. 430/5 |

OTHER PUBLICATIONS

"Layout Printability Optimization using a Silicon Simulation Methodology", IEEE Computer Society, 2004, Michel Cote, Philippe Hurat.*
"Advanced Physical Models for Mask Data Verification and Impacts on Physical Layout Synthesis", IEEE Computer Society, Proceedings of the Fourth International Symposium on Quality Electroic Design, 2003, Qi-De Qian, Sheldon X.-D. Tan.*

* cited by examiner

*Primary Examiner*—Leigh M. Garbowski
(74) *Attorney, Agent, or Firm*—Trexler, Bushnell, Giangiorgi & Blackston Ltd.

(57) ABSTRACT

A method for verifying reticle enhancement technique latent image sensitivity to mask manufacturing errors. The method includes the steps of revising a polygon based on mask CD distributions to provide a virtual mask, imaging the virtual mask to obtain response function statistical parameters, and comparing the statistical parameters to process tolerance requirements. Preferably, the method includes the steps of simulating an aerial and/or latent image of the virtual mask, calculating response functions based on the mask image simulation, collecting measurements and calculating statistical parameters based on the response functions, and comparing the statistical parameters with design rule requirements (i.e., for DI yield percentage for required mask manufacturing specification). The virtual mask is obtained by using mask CD distribution to induce statistical variations to layouts which have passed through the conventional OPC procedure.

18 Claims, 2 Drawing Sheets

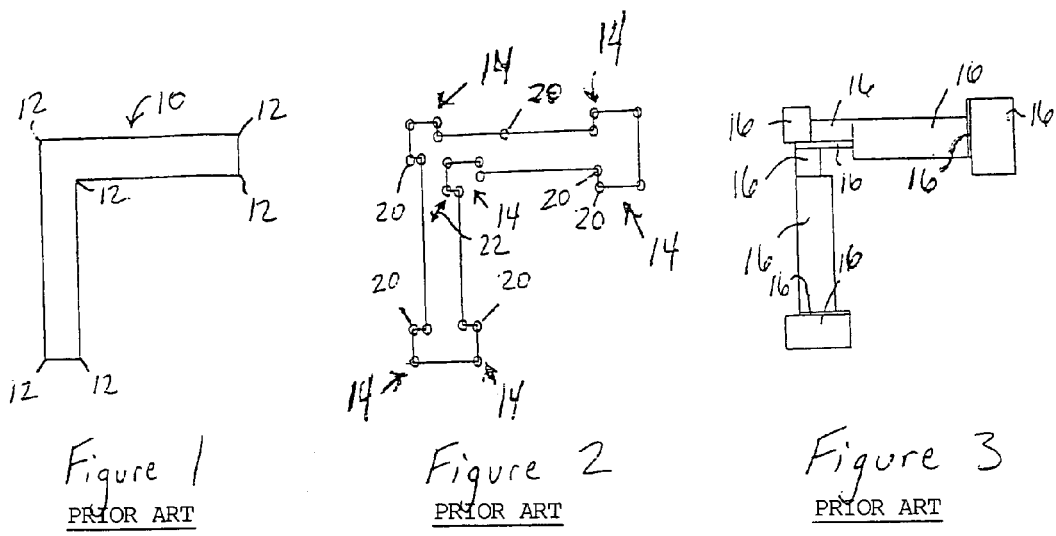
Figure 1. PRIOR ART
Figure 2. PRIOR ART
Figure 3. PRIOR ART
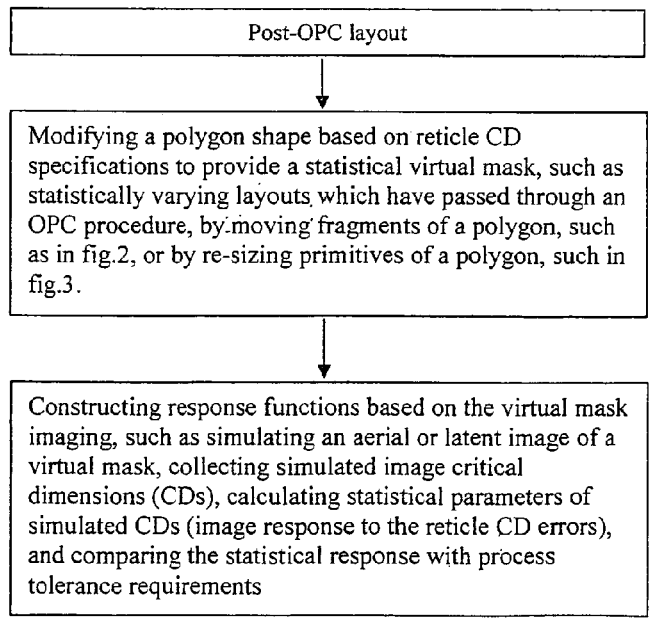
Figure 4.

METHOD AND APPARATUS FOR VERIFYING THE POST-OPTICAL PROXIMITY CORRECTED MASK WAFER IMAGE SENSITIVITY TO RETICLE MANUFACTURING ERRORS

BACKGROUND

The present invention generally relates to photolithography, and more specifically relates to yield prediction tools for mask quality specifications.

Making a semiconductor device, such as an integrated circuit (IC), involves using photolithography to form patterns on a wafer, where the patterns correspond to complex circuitry. During the process, the patterns are initially formed on a reticle or mask, and then the patterns are exposed on the wafer by shining a light through, or illuminating, the mask.

A mask is typically a transparent silica (quartz) which contains a pattern, wherein opaque regions on the mask are formed of an ultraviolet light-absorbing layer, such as iron oxide. Typically, the pattern is created by a computer-controlled electron beam driven by the circuit layout data, using pattern generation software. A thin layer of electron beam sensitive material called electron beam resist is placed on the iron-oxide-covered quartz plate, and the resist is exposed by the electron beam. A resist is a thin organic polymer layer that undergoes chemical changes if it is exposed to energetic particles, such as electrons or protons. The resist is exposed selectively, corresponding to the patterns that are required. After exposure, the resist is developed in a chemical solution. The iron oxide layer is then selectively etched off in plasma to generate the appropriate patterns.

Depth of focus (DOF) indicates the range of distances around a focal plane where the image quality is sharp. It is important to optimize the illumination of a mask to achieve maximum common DOF, as this results in the best exposure of the wafer. Mask error factor limits the amount of a common process window which is useable.

Optical Proximity Correction (OPC) is common in the industry and involves the pre-compensation of predicted defects of a circuit design. Using empirical data, OPC software creates a mathematical description of the process distortions. Once this description is generated, automated software changes the shapes of the polygons in the pattern layout databases (libraries), moving segments of line edges and adding features that compensate the layout for the distortions to come. The critical layers of the photomask set can then be made using these modified, "pre-distorted" layout designs. When these masks are used to make chips, these predistortions will cancel the process distortions, resulting in better pattern fidelity, higher yield, and enhanced chip performance. FIG. 1 shows a pattern (i.e., polygon) 10 pre-OPC, and FIG. 2 shows the pattern post-OPC. As shown, OPC results in fragmentation 14 of the edges 12 of the polygon (i.e., to compensate the layout for distortions expected to come). After the edges 12 of the polygons are fragmented, post-OPC assembled masks are usually transformed (i.e., fractured) into a set of small primitives 16 before being passed to a mask vendor. This can be shown in the progression from FIG. 2 to FIG. 3.

Despite OPC, mask manufacturing process induces statistical errors, which can cause wafer yield loss (the loss sometimes being referred to as "mask error induced wafer yield loss"). Currently, there is a lack of adequate yield prediction tools for mask quality specifications. The approach currently used to attempt to solve the problem involves common process window analysis. However, common process window analysis is limited to a small set of features, and is not practical for full chip application. Furthermore, common process window analysis is not accurate with regard to predicting mask error induced wafer yield loss.

OBJECTS AND SUMMARY

An object of an embodiment of the present invention is to provide a method for verifying reticle enhancement technique latent image sensitivity to mask manufacturing errors.

Another object of an embodiment of the present invention is to provide an adequate yield prediction tool for mask quality specifications.

Briefly, and in accordance with at least one of the foregoing objects, an embodiment of the present invention provides a method which includes the steps of revising a polygon based on mask Critical Dimension (CD) distributions to provide a virtual mask, imaging the virtual mask to obtain image statistical parameters, and comparing the statistical parameters to process tolerance requirements.

More specifically, the method may include the steps of simulating an aerial and/or latent image of the virtual mask, calculating response functions based on the simulated image, collecting measurements and calculating statistical parameters based on the response functions. and comparing the statistical parameters with process tolerance requirements (i.e., for Development Inspection (DI) yield percentage for required mask manufacturing specification).

The virtual mask is obtained by using mask CD distribution to induce statistical variations to layouts which have passed through the conventional OPC procedure. For example, fragments of the polygons may be moved (either inside or outside) based on a randomly generated number from assumed (or vendor provided) mask CD distribution. This approach is believed to be the most beneficial implementation with regard to full OPC flow procedure. Alternatively, the primitives can be re-sized (either by expansion or shrinkage) depending on the mask CD distribution. This approach is beneficial for applying to fractured data or to final post OPC mask, wherein data volume is sufficiently increased by fracturing into primitives.

BRIEF DESCRIPTION OF THE DRAWINGS

The organization and manner of the structure and operation of the invention, together with further objects and advantages thereof, may best be understood by reference to the following description, taken in connection with the accompanying drawing, wherein:

FIG. 1 illustrates a polygon before OPC;

FIG. 2 illustrates the polygon after OPC, wherein edges of the polygon have been fragmented and moved to account for the litho imaging process distortion;

FIG. 3 illustrates the shape of FIG. 2, after it has been transformed into a set of small primitives;

FIG. 4 provides a flow chart which illustrates a method which is in accordance with an embodiment of the present invention.

DESCRIPTION

Figure 5:
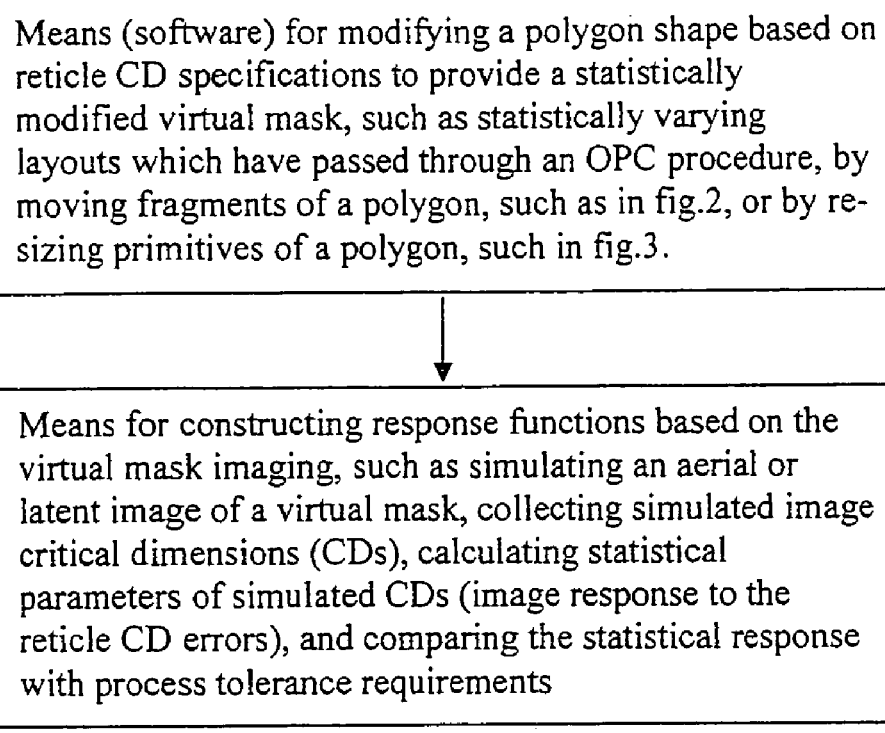
FIG. 5 provides a block diagram of a yield prediction tool for mask quality specifications, wherein the tool can be used to practice the method illustrated in FIG. 4, and wherein the tool is in accordance with an embodiment of the present invention.

While the invention may be susceptible to embodiment in different forms, there are shown in the drawings, and herein will be described in detail, specific embodiments of the invention. The present disclosure is to be considered an example of the principles of the invention, and is not intended to limit the invention to that which is illustrated and described herein.

Mask quality parameters such as across reticle CD distribution affect wafer Development Inspection critical Dimension (DICD) or printability yield (i.e., "below DI yield"), or post-etch wafer Final Inspection Critical Dimension (FICD) (i.e., "below FI yiel"). (Everything is applied to FI-Acid, the method is not limited byte only DI-yield calculation). The parameters needed to control mask quality for acceptable DI yield is determined by the reticle enhancement technique (RET) used for improving wafer printability. The more stringent the requirements for mask quality control, the higher mask cost. Statistical analysis of the wafer DICD/print quality response (i.e., distributions) to the random variations of reticle control parameters can be used for studying the tradeoffs between mask quality and wafer performance in order to determine cost effective mask specifications for optimum DI yield.

FIG. 4 illustrates a method which is in accordance with an embodiment of the present invention. Specifically, FIG. 4 illustrates a method for verifying reticle enhancement technique latent image sensitivity to mask manufacturing errors.

As shown in FIG. 4, the method includes the steps of revising a polygon based on mask CD distributions to provide a virtual mask, working with the virtual mask to obtain response function statistical parameters from the mask image, and comparing the statistical parameters to process tolerance requirements.

More specifically, the method preferably includes the steps of simulating an aerial and/or latent image of the virtual mask, calculating response functions based on the simulated image, collecting measurements and calculating statistical parameters based on the response functions, and comparing the statistical parameters with process tolerance requirements (i.e., for DI yield percentage for required mask manufacturing specification).

The virtual mask is obtained by using mask CD distribution to induce statistical variations to layouts which have passed through the conventional OPC procedure. For example, for statistical analysis, before the mask assembly step, edges of the polygons (identified with circles 20 in FIG. 2) may be moved (either inside or outside, as represented by the double arrow 22 in FIG. 2) based on a randomly generated number from assumed (or vendor provided) mask CD distribution. This approach is believed to be the most beneficial implementation with regard to full OPC flow procedure. Alternatively, the primitives (see FIG. 3) can be re-sized (either by expansion or shrinkage) depending on the mask CD distribution. This approach is beneficial for applying to fractured data or to final post OPC mask, wherein data volume is sufficiently increased by fracturing into primitives.

Once the virtual mask is generated, a simulated image is formed of the virtual mask, the CD or 2-D area is calculated (i.e., "response functions"), measurements are collected, and statistical parameters for CDs and 2-D area are calculated (such as mean, standard deviations, maximum, minimum, etc.). Then, the response functions are compared with process tolerance requirements for DI yield percentage for required mask manufacturing specifications.

The most relaxed distributions of the reticle control parameters (i.e., greater standard deviations, range, etc.) which produces wafer control parameter distributions within acceptable range, by technology design rule specifications, is the optimum reticle specification requirement to comply with.

FIG. 5 is self-explanatory and illustrates a yield prediction tool for mask quality specifications, wherein the tool can be used to practice the method illustrated in FIG. 4, and wherein the tool is also in accordance with an embodiment of the present invention. The tool may be implemented in software, hardware, or a combination thereof.

While embodiments of the present invention are shown and described, it is envisioned that those skilled in the art may devise various modifications of the present invention without departing from the spirit and scope of the appended claims.

What is claimed is:

1. A method for verifying post-optical proximity corrected mask wafer image sensitivity to reticle manufacturing errors, said method comprising: providing a pattern of polygons; moving lines of the pattern to account for predictable distortions; after moving lines of the pattern to account for predictable distortions, statistically modifying the polygons based on reticle critical dimension specifications to construct a statistical virtual mask; obtaining virtual mask image response function statistical parameters; and comparing the statistical parameters to process tolerance requirements.

2. A method as recited in claim 1, further comprising forming a simulated image of the statistical virtual mask.

3. A method as recited in claim 2, further comprising calculating response functions based on the simulated image.

4. A method as recited in claim 3, further comprising collecting simulated image critical dimensions and calculating statistical parameters based on the response functions.

5. A method as recited in claim 4, further comprising comparing simulated wafer critical dimension distributions with process tolerance requirements.

6. A method as recited in claim 1, further comprising obtaining the statistical virtual mask by using reticle critical dimension specifications to induce reticle manufacturing statistical variations to layouts which have passed through an optical proximity correction procedure.

7. A method as recited in claim 6, further comprising at least one of moving fragments of a polygon and re-sizing primitives of a post-optical proximity correction polygon.

8. A method as recited in claim 6, further comprising moving fragments of a post-optical proximity correction polygon based on a randomly generated number from a reticle critical dimension specification.

9. A method as recited in claim 6, further comprising re-sizing primitives depending on a reticle critical dimension specification.

10. A yield prediction tool for mask quality specifications, said tool comprising means for moving lines of a pattern of polygons to account for predictable distortions: means for statistically modifying the polygons based on reticle critical dimension specifications to construct a statistical virtual mask, after moving lines of the pattern to account for predictable distortions; means for obtaining virtual mask imaging response function statistical parameters; and means for comparing the statistical response parameters to process tolerance requirements.

11. A tool as recited in claim 10, further comprising means for simulating an aerial and/or latent image of the statistical formed virtual mask.

12. A tool as recited in claim 11, further comprising means for calculating response functions based on the simulated image.

13. A tool as recited in claim 12, further comprising means for collecting simulated image critical dimensions and calculating statistical parameters based on the response functions.

14. A tool as recited in claim 13, further comprising means for comparing simulated wafer critical dimension distributions with process tolerance requirements.

15. A tool as recited in claim 10, further comprising means for obtaining the statistical virtual mask by using riticle critical dimension specifications to statistically vary layouts which have passed through an optical proximity correction procedure.

16. A tool as recited in claim 15, further comprising means for at least one of moving fragments of a polygon and re-sizing primitives of a post-optical proximity correction polygon.

17. A tool as recited in claim 15, further comprising means for moving fragments of a post-optical proximity correction polygon based on a randomly generated number from a reticle critical dimension specification.

18. A tool as recited in claim 15, further comprising means for re-sizing primitives depending on a reticle critical dimension specification.

\* \* \* \* \*